United States Patent [19]

Ducarroir et al.

[11] Patent Number: 4,942,062
[45] Date of Patent: Jul. 17, 1990

[54] PROCESS FOR PRODUCING BORON CARBIDE COATINGS OF CONTROLLED HARDNESS

[75] Inventors: Michel R. Ducarroir, Odeillo; Germain J. Male, Saillagouse; Marcel F. Nadal, Perpignan; Alain G. Basse; Gérard P. Pizzini, both of Pau; Didier P. Cazajous, Lanne, all of France

[73] Assignee: Coating Development Societe Anonyme, Saint-Etienne, France

[21] Appl. No.: 851,080

[22] PCT Filed: Jun. 3, 1985

[86] PCT No.: PCT/FR85/00136

§ 371 Date: Apr. 28, 1986

§ 102(e) Date: Apr. 28, 1986

[87] PCT Pub. No.: WO86/00345

PCT Pub. Date: Jan. 16, 1986

[30] Foreign Application Priority Data

Jun. 27, 1984 [FR] France ............... 84 10290

[51] Int. Cl.$^5$ ............... C23C 16/32; C23C 16/52
[52] U.S. Cl. ............... 427/249; 427/255; 427/255.2; 427/419.7
[58] Field of Search ............... 427/249, 255, 255.7, 427/402, 154, 419.7, 255.2, 331; 428/704, 688; 423/439; 264/81, 139

[56] References Cited

U.S. PATENT DOCUMENTS

| | | | |
|---|---|---|---|
| 3,537,877 | 11/1970 | Reeves et al. | 427/249 |
| 3,799,830 | 3/1974 | Allen | 427/249 |
| 3,846,224 | 11/1974 | LeClercq et al. | 427/249 |
| 3,967,029 | 6/1976 | Veltri et al. | 427/249 |
| 4,045,597 | 8/1977 | Debolt | 427/249 |
| 4,225,355 | 9/1980 | Galasso et al. | 427/249 |
| 4,287,259 | 9/1981 | Riley et al. | 427/249 |
| 4,525,417 | 6/1985 | Dimigen et al. | 427/249 |
| 4,540,596 | 9/1985 | Nimmagadda | 427/249 |

OTHER PUBLICATIONS

Chemical Abstracts, vol. 74, 1971, 131438z.
Vandenbulcke et al., "Composition & Structural Changes of Boron Carbides Deposited by Chemical Vapour Deposition Under Various Conditions of Temperature & Supersaturation", J. of the Less Common Metals, vol. 82, pp. 49–56, 1981.

Primary Examiner—Sadie Childs
Attorney, Agent, or Firm—Harold H. Dutton, Jr.

[57] ABSTRACT

A process for producing a coating of boron carbide of predetermined, controlled hardness on a substrate comprising heating the surface of the substrate to a temperature of between 800° C. and 1200° C., reducing a gaseous mixture containing at least one boron compound and at least one carbon compound in the presence of the heated substrate while causing the gas mixture to flow over the heated surface of the substrate at a total pressure of less than or equal to 100 millibars and at an average flow rate of between $10^{-4}$ and $10^{-3}$ g.cm$^{2.5-1}$ so as to deposit a coating comprising tetragonal boron carbide $B_{50}C_2$ or rhombohedral boron carbide $B_{13}C_2$ or a mixture thereof, establishing a curve of the variation of the hardness of the coating as a function of the composition of the gas mixture for the conditions of temperature, pressure and flow rate selected, determining the value of the composition corresponding to the hardness of the coating obtained and adjusting the composition of the gas mixture for obtaining a predetermined hardness.

6 Claims, 2 Drawing Sheets

PROCESS FOR PRODUCING BORON CARBIDE COATINGS OF CONTROLLED HARDNESS

The invention concerns a process for the production of boron carbide coatings on the surface of a substrate; it includes the coatings produced.

The invention applies in particular to obtaining cutting tools and wear pieces with excellent properties of hardness and resistance to abrasion and erosion.

It is known to coat pieces of various materials and shapes by means of ceramic coatings (TiC, TiN, Ti(CN), $Al_2O_3$) in order to increase their resistance to erosion and abrasion. Nevertheless, the hardness of these coatings remains inadequate for certain applications, in particular in the case of drilling tools.

As well as this it is known to use sintered boron carbide $B_4C$ for production of items resistant to erosion; the hardness of these large pieces is significantly improved compared to the coatings previously mentioned, but these pieces are extremely fragile and their resilience (characterizing their resistance to shock) is incompatible with their use as cutting tools.

Elsewhere certain laboratory work discloses the preparation of compounds of the boron/carbon system by their deposition in the vapour phase by reaction between a compound of boron and a compound of carbon, in the gaseous state. (A M Moore, H F Volk: Final report AMMRC CR 69-10 (1969) Union Carbide Corporation carbon products division, Parma OHIO; A A Cochran, J B Stephenson. J G Donaldson. J. of Metals, 22 (1970) pp 37–42; K PLOOG: J Less Common Metals 35 (1974) pp 115–145; L Vandeubulcke et al; J. Less Common Metals 82 (1981) pp 49–56; 80 (1981) pp 7–22).

In these experiments the deposit is obtained in a rapid gas flow (above $1 \times 10^{-3} g.cm^{-2}.s^{-1}$), most often at atmospheric pressure and a high temperature; their aim is a study of the boron-carbon system or the preparation of a boron carbide whose composition approaches $B_4C$.

A recent application of this type of coating ($B_4C$) is described in U.S. Pat. No. 4,287,259 and consists of making the deposit on graphite fibre fabrics in order to improve their chemical inertness and their resistance to corrosion with the object of using them in the nuclear industry. In this application, the vaporous deposit obtained is made up of an amorphous form of which the atomic carbon content is about 30%.

In certain technical areas and particularly in the drilling industry it is desirable, because of the application envisaged, to get the best compromise between hardness and resilience so that the coating benefits from an increased hardness (better than that of known coatings) while showing a resistance to shock adapted to the application.

Consequently the present invention seeks to provide a new coating of boron carbides on a large substrate. The hardness of the coating, notably superior to that of known industrial coatings, being in the range 3200–5100 kg/mm² (micro-hardness Knoop determined by an "OLP" micro-hardness meter equipped with a Knoop pyramid under a load of 100g. in future we will always use this definition of hardness which will be called $HK_{0.1}$)

An essential objective of the invention is to allow a precise adjustment of the hardness of the coating in this range according to the intended application, so as to get the best compromise between hardness and resilience for that application.

To achieve this, the process of the invention consists of depositing on the surface of the substrate one of or a mixture of the following crystalline forms: tetragonal form $B_{50}C_2$); rhombohedral form ($B_{13}C_2$). Such a deposit has a hardness $HK_{0.1}$ within the range 3200 to 5100 kg/mm². To get the desired hardness in this range one adjusts the atomic ratio C/B of the deposit, in a range which runs from 0.04 to 0.22, to a value which is directly proportional to the desired hardness.

The process, which is preferably carried out by chemical deposit in the vapour phase, consists of reducing a gaseous mixture containing at least one compound of boron, preferably boron trichloride, and at least one compound of carbon, preferably methane; it is characterized by the following conditions which bring about the appearance of the previously mentioned crystalline forms:

the surface of the substrate is heated to a temperature between 800° and 1200° C., the gaseous mixture is blown across the surface of the substrate with an average flowrate in the range $10^{-4}$ to $10^{-3}$ $g.cm^{-2}.s^{-1}$, the total pressure of the gaseous mixture is adjusted to a value of 100 millibars or less, the ratio in the gaseous mixture of boron compound to carbon compound is adjusted so that the atomic ratio C/B of carbon to boron present in the gaseous mixture lies between 0.05 and 6 (approx).

If a gaseous mixture of boron trichloride and methane is used the reaction is carried out in the presence of hydrogen in sufficient quantity to ensure reduction; the atomic ratio C/B is adjusted to an appropriate value in the previously mentioned range, relative to the hardness required, by controlling the concentration of methane Dc and the concentration of boron trichloride, Db. In practice the ratio $$R = \frac{100 \cdot Dc}{Db + Dc}$$

is adjusted to a value between 5 and 85, directly proportional to the required hardness.

The total reaction which takes place on the surface of the substrate is the following:

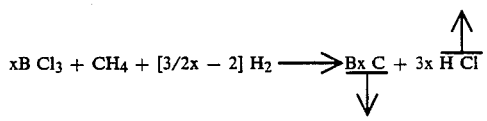

Analysis of the boron carbide previously mentioned (BxC). carried out by X-ray diffraction, shows that operating conditions of low pressure with a low initial flow of the gaseous mixture permits, in the stated temperature range, the formation of two crystalline forms: one tetragonal, whose composition is close to $B_{50}C_2$, and the other rhombohedral, whose composition is close to $B_{13}C_2$ it has been shown that these forms have compositions which vary about those corresponding to the two given formulae. A variation in the ratio R of the gas concentrations of the initial mixture enables one to vary, on the one hand the composition of these forms, and on the other hand their relative proportions. The hardness of the coating obtained depends on these compositions and proportions and thus can be adjusted by the operator.

Furthermore, it has been shown that variations in the initial gas flow-rate in the range mentioned above, or in the pressure below the mentioned value, do not appreciably affect the composition of the deposit.

The figures in the attached drawings show diagrammatically the results obtained:

of the initial gas concentrations for a given temperature (1125° C.).

Figure 1:
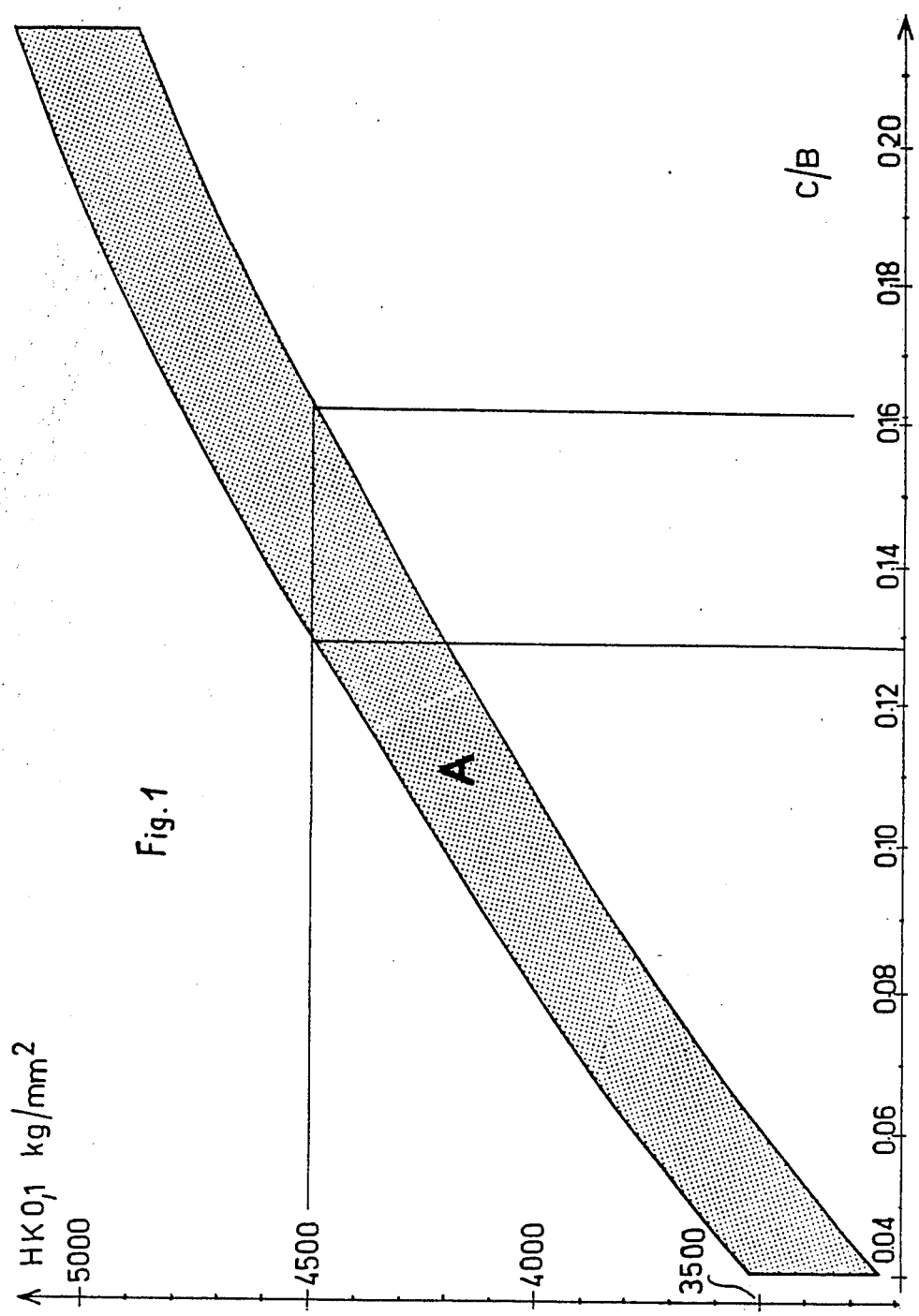
FIG. 1 is a diagram giving the relation of the hardness $HK_{0.1}$ of the coatings obtained to the atomic ratio C/B thereof.

As illustrated in FIG. 1, the hardness of the deposit made up of one or other of the crystalline forms mentioned before or by a mixture of both is (directly) proportional to the concentration of carbon in this deposit.

The uncertainty in the experimental results leads to a zone A, in the interior of which will be chosen a ratio C/B to produce the desired hardness.

The latter varies between about 3,200 and 5,100 kg/mm$^2$ (microhardness $HK_{0.1}$) for an atomic ratio C/B varying between 0.04 and 0.22. Values of C/B close to 0.04 correspond to the formation of the tetragonal form $B_{50}C_2$ alone, whose composition is slightly variable. Values of C/B above 0.04 to about 0.12 correspond to a mixture of the tetragonal $B_{50}C_2$ and the rhombohedral $B_{13}C_2$ forms. Values between 0.12 and 0.22 correspond to the form $B_{13}C_2$ alone, a form with a large domain of homogeneity whose composition therefore has a great range of variation.

Figure 2:
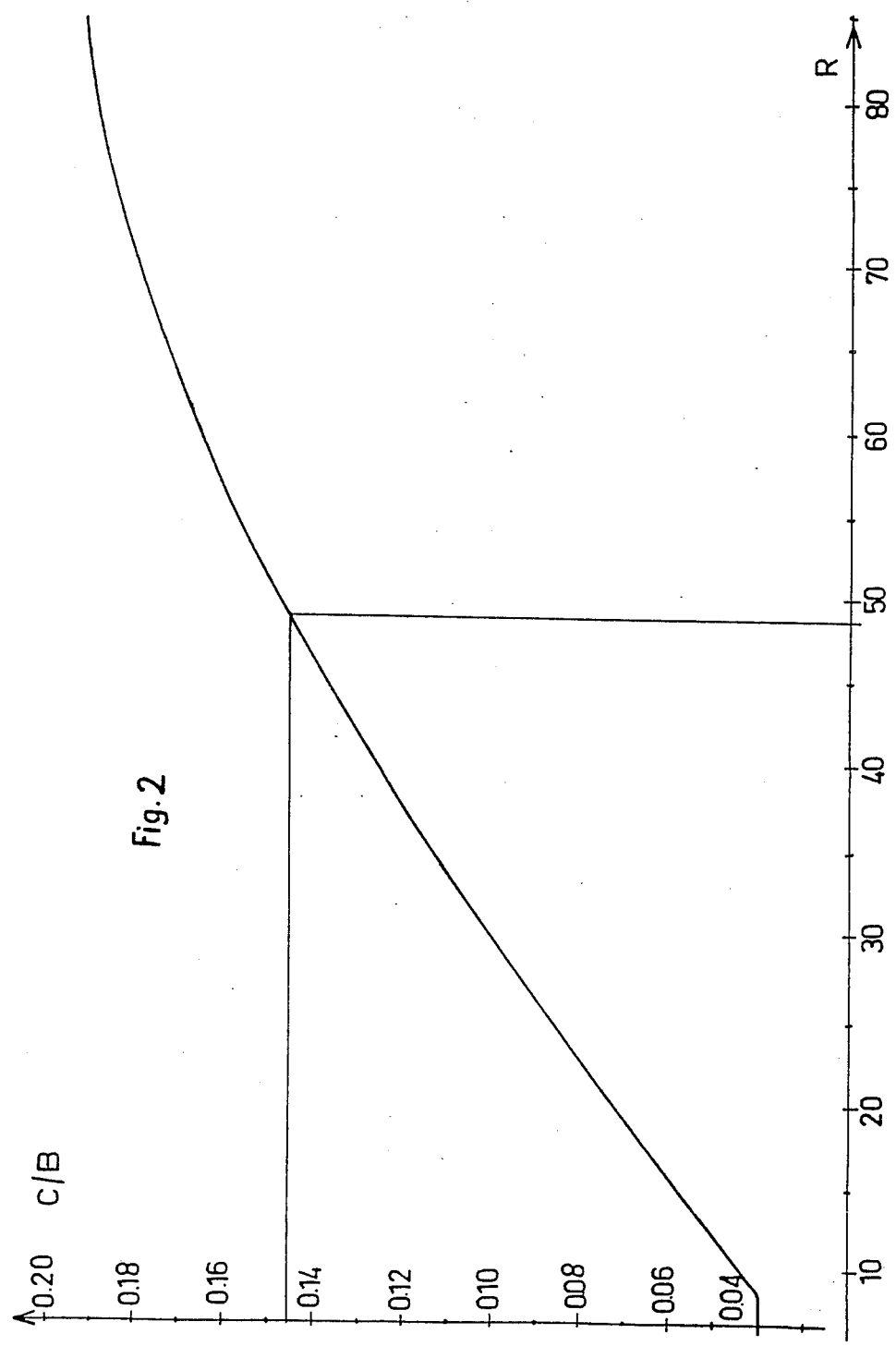
FIG. 2 illustrates, by way of example, the variation of the atomic ratio C/B of the coatings relative to the ratio $$R = \frac{100 \cdot Dc}{Db + Dc}$$

FIG. 2 illustrates the relationship between variations in the ratio C/B of the coating and the ratio $$R = \frac{100 \cdot Dc}{Db + Dc}$$

in the case where the process takes place in the vapour phase, using a gas flow of methane, boron trichloride and hydrogen. This ratio R is the essential parameter which fixes the nature, the proportion and the composition of the forms and consequently the mechanical properties of the deposit.

FIG. 2 shows the results obtained by performing the process at a temperature of 1125° C.; this curve will be displaced depending on the temperature and therefore will be experimentally traced in each application depending on the temperature chosen to make the deposit.

The other conditions of the process (pressure, rate of flow) have a negligible influence but must be within the ranges previously laid down.

If one supposes for example that the best compromise between hardness and resilience corresponds to a hardness of 4500 kg/mm$^2$, the necessary ratio C/B of the coating must be between about 0.13 and 0.16: one could choose a mean value 0.145 (FIG. 1).

Using a temperature of 1125° C. such a coating is got with a ratio R of the order of 50 (FIG. 2). Thus it is easy to adjust the operating conditions to get the desired hardness. (In this example the coating obtained is made up of the rhombohedral form of variable composition, $B_{13}C_2$)

The deposit can be made on any substrate suited to the application which will withstand the temperature of the process; it should be noted that the temperature range of the process (800°-1200° C.) allows substrates such as tungsten carbide or steels to be coated without affecting their structure irreversibly.

The deposit can be made directly on the substrate or after interposing a diffusion barrier on its surface. This barrier, made in particular of titanium carbide, titanium nitride or silicon carbide, . . . suppresses chemical or physico-chemical interactions between the substrate and the coating.

It is possible by the process of the invention to get large pieces of boron carbide. The coating is then formed of a thickness sufficient to provide appropriate mechanical strength (thickness above 100 microns); after forming the deposit the coating is separated from the substrate in order to obtain the required large piece.

In this case the substrate will be chosen so as to have weak adhesion to the coating (graphite, boron nitride); the separation can be effected by chemical or mechanical destruction of the substrate, particularly in the case of hollow pieces.

The examples 1–4 which follow illustrate the process of the invention; all these examples have been carried out in the vapour phase by means of a gas flow consisting of methane, boron trichloride and hydrogen in excess.

EXAMPLE 1

Direct deposit of boron carbides on substrate of sintered tungsten carbide with cobalt as binder Parameters:

T=1020° C., total pressure $P_T$=10 mbar
$Db(BCl_3)$=1.5 l. h$^{-1}$, $Dc(CH_4)$=1 l. h$^{-1}$
$D(H_2)$=5 l. h$^{-1}$, R=40, Duration:
$\Delta t$=150 min
Flow rate of the gas mixture =4×10$^{-4}$g.cm$^{-2}$.s$^{-1}$
Substrate : [WC +Co 15 %]
Thickness of deposit=36–40 μm
Mean hardness ($HK_{0.1}$)
Deposit=3800±150 kg.mm$^{-2}$
Substrate=1260±40 kg.mm$^{-2}$ It should be noted that in this case the boron emanating from the reaction diffuses into the substrate and forms a sub-layer of cobalt boride (BCo) which surrounds the particles of tungsten carbide. The thickness of this sub-layer intermediate between the coating properly so called and the substrate varies with the duration of the treatment and the concentration of cobalt in the substrate. The hardness of this substrate is intermediate between that of the substrate and that of the coating, e.g. of the order of 1430 kg/mm$^2$. The bed of boron carbides which develops above it is dense (very low porosity) and macroscopically homogeneous.

The interface between the coating and the sub-layer consists of a bed of pure BCo 1–2 μm thick. The morphology of the sub-layer depends on the concentration of Co in the substrate. In fact the cobalt diffuses towards the surface creating numerous pores, by the Kirkendal effect, in the case of large concentrations (30%). The porosity is much reduced and even disappears in the case of low concentrations of cobalt in the substrate (15%).

X-ray diffraction (RX) gives the spectrum of the biphase $B_{50}C_2$ +$B_{13}C_2$ for the coating.

EXAMPLE 2

Deposit of boron carbides on pieces of sintered tungsten carbide, a diffusion barrier having been interposed.

The diffusion of boron towards the substrate is stopped by the prior deposit of a layer of titanium carbide (TiC) several microns thick.

Thus the deposit of boron carbide is made, as it were, onto a non-reactive substrate.

Substrate [WC +Co 7 %]+TiC (10 μm)
 $T=1020°$ C.; $PT=10$ mbar
 $Db=1.5$ l/h, $Dc=1$ l/h
 Flow rate $=4\times 10^{-4}$ g.cm$^{-2}$.s$^{-1}$
 $R=40$; $D(H_2) =5$ l.h$^{-1}$; $\Delta t=150$ min
 Thickness of deposit $=30$ μm
 Hardness $HK_{0.1}$ of deposit$=3800\pm 150$ kg/mm$^2$

EXAMPLE 3

A substrate made of steel with a diffusion barrier

Substrate steel 35 CD 4 $=$TiC (0.5-1 μm)
 $T=980°$ C.; $P=10$ mbar
 $Db=1$ l/h; $Dc=1$ l/h
 Flow rate$=2.89\times 10^{-4}$g.cm$^{-2}$.s$^{-1}$
 $R=50$; $D(H_2)=5$ l.h$^{-1}$ $\Delta t=45$ min
 Thickness of deposit: 8-10 μm
 Hardness $HK_{0.1}$ :$3500\pm 150$ kg/mm$^2$.

EXAMPLE 4

Deposit of boron carbide on a non-reactive substrate

Using a graphite substrate several experiments were carried out varying the ratio R and keeping the same temperature (1125° C.), the same total pressure (10 mbar) and the same throughput of hydrogen (5 l.h$^{-1}$) during the process.

The complementary operating conditions and the characteristics found for three of these experiments are given below:

1/— $R=9$
 $Db=1.5$ l.h$^{-1}$; $Dc=0.15$ l.h$^{-1}$
 Gas flow rate$=3.79\times 10^{-4}$g.cm$^{-2}$.s$^{-1}$
 Hardness $HK_{0.1} =3400\pm 150$ kg.mm$^{-2}$
 Form (R"X")$=B_{50}C_2$ 2/— $R=28.6$
 $Db=1.5$ l.h$^{-1}$; $Dc=0.6$ l.h$^{-1}$
 Flow$=3.94\times 10^{-4}$g.cm$^{-2}$.s$^{-1}$
 Hardness $HK_{0.1}=3900\pm 150$ kg.mm$^{-2}$
 Form (R"X")$=B_{13}C_2 +B_{50}C_2$ 3/— $R=60$
 $Db=1.3$ l.h$^{-1}$; $Dc=2$ l.h$^{-1}$
 Flow$=3.92\times 10^{-4}$g.cm$^{-2}$.s$^{-1}$
 Hardness $HK_{0.1}=4650\pm 150$ kg.mm$^{-2}$
 Form (R"X")$=B_{13}C_2$ Example 5 which follows gives comparative results for trial borings with uncoated substrates and substrates coated according to the process of the invention.

EXAMPLE 5

Comparative boring trials

Comparative boring trials on a test cell were carried out to provide evidence of the influence of boron carbide on the boring parameters (speed and depth).

The trials were carried out with, on the one hand, slugs of tungsten carbide with cobalt binder and, on the other hand, similar slugs coated with boron carbide.

The deposits of boron carbide were laid down under the following conditions:
On slugs I (WC$=94\%$−CO $5.5\%$−Tac$=0.5\%$)
On slugs II (WC$=88\%$ −Co $9\%$ −Tac$=3\%$)

$T=1020°$ C.
 $Pt=1$ mbar
 $Db=12$ l.h$^{-1}$
 $Dc=8$ l.h$^{-1}$
 $Dh2=30$ l.h$^{-1}$
 $R=40$
 $t=180$ min The trial conditions were as follows:
Throughput: 40 l/min (usage of drilling fluid)
Rotation: 750 rpm
Weight of tool: 425 kg
Rocks bored: pierre bleu or petit granite In the case of the non-coated slugs the drilling was stopped when the speed of advance was less than 5 cm/min. In the case of the slugs coated with boron carbide the drilling was stopped when the speed of advance was less than 8 cm/min., that is to say when the coating had been used up and it could be considered that the drilling was being carried out by the substrate only.

| Slug | I uncoated | I coated | II uncoated | II coated |
| --- | --- | --- | --- | --- |
| Boring time | 11 min 25 s | 15 min 23 s | 6 min 30 s | 13 min 26 s |
| Depth of bore | 110 cm | 457 cm | 50 cm | 353 cm |
| Average speed of advance | 9.64 cm/min | 29.71 cm/min | 9.09 cm/min | 26.28 cm/min |
| Max speed registered | 15 cm/min | 46 cm/min | 12.5 cm/min | 49.4 cm/min |

We claim:

1. A process for producing a coating of boron carbide of controlled hardness on a substrate comprising heating the surface of the substrate to a temperature of between 800° C. and 1200° C., reducing a gaseous mixture comprising at least one boron compound and at least one carbide compound in the presence of the heated substrate while causing the reduced gas mixture to flow over the heated surface of the substrate at a total pressure of less than or equal to 100 millibars with an average flow rate of between $10^{-4}$ and $10^{-3}$ g.cm2.5-1, in such a manner as to deposit a coating comprising one or a mixture of phases selected from the group consisting of tetragonal $B_{50}C_2$ and rhombobedral $B_{13}C_2$, establishing a curve of the variation of the hardness of the coating as a function of the composition of the gaseous mixture for conditions of temperature, pressure and flow rate selected, determining the value of the composition corresponding to the hardness of the coating obtained, and adjusting the composition of the gaseous mixture for obtaining a predetermined hardness.

2. A process as in claim 1 and including establishing said curve of the variation of the hardness of the coating by varying said gaseous mixture such that the atomic ratio C/B of carbon to boron in said gaseous mixture is within the range of 0.05 to 6.

3. A process as in claim 1 and wherein said gaseous mixture comprises a mixture of boron trichloride and methane with hydrogen sufficient to assure said reduction, establishing said curve of the variation of the hardness of the coating by mixing the flow rates of methane 'Dc' and of boron trichloride 'Db' such that the ratio $$\frac{100\, Dc}{Db + Dc}$$

is between 5 and 85, and adjusting hardness of the coating obtained by adjusting the ratio of the flow rates to the value corresponding to the desired hardness.

4. A process as in claim 1 and wherein the substrate comprises a material selected from the group consisting of graphite, boron nitride, tungsten carbide and steel.

5. A process as in claim 1 and wherein the substrate has on the surface thereof a diffusion barrier selected from the group consisting of titanium carbide, titanium nitride and silicon carbide.

6. A process as in claim 1 and including forming said coating with a thickness of greater than 100 microns on said substrate and removing said coating from said substrate so as to provide a mass of boron carbide of the desired hardness.

* * * * *